US012803513B2

(12) United States Patent
Nagata et al.

(10) Patent No.: US 12,803,513 B2

(45) Date of Patent: Nov. 17, 2026

(54) SELF-BIASED AMPLIFIER CIRCUIT AND A METHOD FOR CONTROLLING A SELF-BIASED AMPLIFIER CIRCUIT

(71) Applicant: IMEC VZW, Leuven (BE)

(72) Inventors: Shun Nagata, Leuven (BE); Ewout Martens, Heverlee (BE); Jan Craninckx, Boutersem (BE)

(73) Assignee: IMEC VZW, Leuven (BE)

( * ) Notice: Subject to any disclaimer, the term of this patent is extended or adjusted under 35 U.S.C. 154(b) by 398 days.

(21) Appl. No.: 18/538,091

(22) Filed: Dec. 13, 2023

(65) Prior Publication Data

US 2024/0213938 A1 Jun. 27, 2024

(30) Foreign Application Priority Data

Dec. 21, 2022 (EP) .................................... 22215309

(51) Int. Cl.
*H03F 3/45* (2006.01)

(52) U.S. Cl.
CPC .................... *H03F 3/45179* (2013.01); *H03F 2203/45154* (2013.01)

(58) Field of Classification Search
CPC ...... H03F 1/0272; H03F 1/02; H03F 3/45237; H03F 3/45; H03F 3/30; H03F 2200/18; H03F 2200/24; H03F 2200/27; H03F 2200/555; H03F 2203/45134; H03F 2203/45112
USPC .......................................................... 330/253
See application file for complete search history.

(56) References Cited

U.S. PATENT DOCUMENTS

| | | | | |
|---|---|---|---|---|
| 3,870,966 A | 3/1975 | Dingwall | | |
| 6,930,550 B1 * | 8/2005 | Wu | ........................ | H04L 25/028 330/261 |
| 7,227,411 B2 | 6/2007 | Slamowitz | | |
| 7,525,383 B2 | 4/2009 | Kobayashi et al. | | |
| 8,823,454 B2 | 9/2014 | Sanchez | | |
| 10,615,712 B2 | 4/2020 | Park et al. | | |
| 11,528,441 B2 * | 12/2022 | Morishita | ............... | H03M 1/56 |
| 2022/0210364 A1 * | 6/2022 | Morishita | ............... | H03M 1/56 |

FOREIGN PATENT DOCUMENTS

CN 106160681 A 11/2016

OTHER PUBLICATIONS

Bazes, "Two Novel Fully Complementary Self-Biased CMOS Differential Amplifiers", IEEE Journal of Solid-State Circuits, vol. 26, No. 2, pp. 165-168, Feb. 1991.

(Continued)

*Primary Examiner* — Hafizur Rahman

(74) *Attorney, Agent, or Firm* — MOSER TABOADA

(57) ABSTRACT

A self-biased amplifier circuit, comprises: an input, wherein the input comprises input transistors forming inverters; bias transistors, wherein a source of each input transistor is connected to a drain of a bias transistor for providing a bias current to the inverters; an output connected to a first output node and/or a second output node; and pairs of transistor switches connected between the first or the second output node and a respective gate of the bias transistors, wherein the pairs of transistor switches are configured to control the self-biased amplifier circuit to assume an active mode or a standby mode.

11 Claims, 5 Drawing Sheets

(56) References Cited

OTHER PUBLICATIONS

Figueiredo et al: "A two-stage fully differential inverter-based self-biased CMOS amplifier with high efficiency", IEEE Transactions on Circuits and Systems—I:Regular Papers, vol. 58, No. 7, pp. 1 and 1591-1603, Jul. 2011.
Milovanovic et al: "On fully differential and complementary single-stage self-biased CMOS differential amplifiers", Eurocon 2013, pp. 1955-1963, Jul. 2013.
Mansuri et al: "A low-power adaptive bandwidth PLL and clock buffer with supply-noise compensation", IEEE Journal of Solid-State Circuits, vol. 38, No. 11, p. 1 and 1804-1812, Nov. 2003.
Cordaro: "Complementary FET Differential Amplifier", IBM Technical Bulletin, vol. 16, No. 10, pp. 3227-3228, Mar. 1974.
Kook et al: "Clock distribution scheme for high-speed DRAM", Electronics Letters, vol. 38, No. 13, pp. 1-2, Jun. 2002.
Extended European Search Report in EP22215309.0 dated Jun. 15, 2023.

* cited by examiner

SELF-BIASED AMPLIFIER CIRCUIT AND A METHOD FOR CONTROLLING A SELF-BIASED AMPLIFIER CIRCUIT

CROSS-REFERENCE TO RELATED APPLICATIONS

The present application claims the benefit of and priority to EP Patent Application Serial No. 22215309.0, filed Dec. 21, 2022, the entire contents of which is incorporated herein by reference.

TECHNICAL FIELD

The present description relates to a self-biased amplifier circuit and a method for controlling a self-biased amplifier circuit.

BACKGROUND

Electronic circuitries are used in various applications where a low power consumption is important. For instance, devices that are to be arranged in remote locations, e.g., in Internet of Things (IOT) devices, or devices that are to be implanted in a body, may need to be battery powered and re-charging should occur rarely. Thus, there is a need for low power consumption in electronic circuitries.

An amplifier circuit using a self-biasing structure may limit a current of the circuit for a low power consumption without any additional current source circuit. However, the circuit may need switch(es) for shutting down the circuit when the circuit is not needed to run under operation of the device, since the self-biasing structure may otherwise force the circuit into an operation mode.

However, the additional switch(es) may degrade performance of the circuit and in order to avoid affecting performance, the additional switch(es) may need to have a large area. Thus, the amplifier circuit may not be compact, which may also be of high importance in many devices.

For instance, in analog-to-digital converters (ADCs), an amplifier circuit forming a clock buffer that converts a sinusoidal wave clock signal to approximately a square-wave clock signal may be needed. Using a self-biasing structure, low power consumption of the clock buffer may be achieved. The clock buffer may need to implement switches for shutting down the circuit.

Thus, there is a need for ensuring a low power consumption of a self-biased amplifier circuit, such as a self-biased clock buffer, while having a compact circuit.

SUMMARY

An objective of the present description is to provide a self-biased amplifier circuit with low power consumption.

This and other objectives are at least partly met by the invention as defined in the independent claims. Preferred embodiments are set out in the dependent claims.

According to a first aspect, there is provided a self-biased amplifier circuit, comprising: an input, wherein the input comprises a first and a second input node for receiving a first input signal and a second input signal forming a differential input signal, wherein the input comprises a first p-channel metal-oxide-semiconductor (PMOS) input transistor and a first n-channel metal-oxide-semiconductor (NMOS) input transistor forming two complementary input transistors at the first input node and each configured to receive the first input signal at a gate, and wherein the input comprises a second PMOS input transistor and a second NMOS input transistor forming two complementary input transistors at the second input node and each configured to receive the second input signal at a gate, wherein a drain of the first PMOS input transistor and a drain of the first NMOS input transistor are connected to each other to form an inverter defining a first output node therebetween and wherein a drain of the second PMOS input transistor and a drain of the second NMOS input transistor are connected to each other to form an inverter defining a second output node therebetween; at least one PMOS bias transistor and at least one NMOS bias transistor, wherein a source of each of the first and the second PMOS input transistor is connected to a drain of the at least one PMOS bias transistor and wherein a source of each of the first and the second NMOS input transistor is connected to a drain of the at least one NMOS bias transistor for providing a bias current to the inverters; an output connected to at least one of the first output node and the second output node for providing an output signal; and a first and a second transistor switch, wherein the first transistor switch is connected between the first or the second output node and a gate of the at least one PMOS bias transistor, and wherein the second transistor switch is connected between the first or the second output node and a gate of the at least one NMOS bias transistor, wherein the first and the second transistor switches are configured to control the self-biased amplifier circuit to assume an active mode or a standby mode.

According to the first aspect, the self-biased amplifier circuit comprises switches connected between the first or the second output node and the gates of the PMOS bias transistor and the NMOS bias transistor. The switches may be used for controlling the self-biased amplifier circuit to assume the active mode or the stand-by mode. Thus, the self-biased amplifier circuit may be selectively controlled into the stand-by mode for limiting power consumption of the self-biased amplifier circuit.

Thanks to the arrangement of the switches in the self-biased amplifier circuit, only a small current need to pass through the switches, since the switches only need to drive gates of the at least one PMOS bias transistor and the at least one NMOS bias transistor, respectively.

The switches may have a small effect on performance of the self-biased amplifier circuit. For instance, if the self-biased amplifier circuit forms a self-biased clock buffer, the switches may have a relatively small effect on clock duty cycle and clock jitter.

The self-biased amplifier circuit may tolerate a large on-resistance of the switches without degradation or insignificant degradation of performance, such as clock jitter of a self-biased clock buffer. This implies that a size of the switches may be small. Hence, the self-biased amplifier circuit may be compact as size of switches may be small.

Further, a small size of the switches implies that the switches may have a small parasitic capacitance. This also implies that the self-biased amplifier circuit may have a low power consumption and fast transition times.

In the active mode, output voltage at the first or the second output node may be low pass filtered and provided via the transistor switches to the gate of the at least one PMOS bias transistor and the gate of the at least one NMOS bias transistor. The at least one PMOS bias transistor and the at least one NMOS bias transistor may then generate the bias currents that are provided to the inverters, i.e., to the first PMOS input transistor and the first NMOS input transistor forming a first inverter and to the second PMOS input transistor and the second NMOS input transistor forming a second inverter. The inverters may form voltage gain stages of the self-biased amplifier circuit.

In the stand-by mode, the transistor switches may be turned off so as to cut a connection between the first or the second output node and the gates of the at least one PMOS bias transistor and the at least one NMOS bias transistor. This may imply that amplification by the inverters to which the bias currents are provided may be, at least after some time, turned off.

The first and the second transistor switches may be configured to control the self-biased amplifier circuit to assume the active mode by providing a self-biased gate voltage to the at least one PMOS bias transistor and to the at least one NMOS bias transistor or to assume the stand-by mode wherein the self-biased gate voltage is not provided to the at least one PMOS bias transistor and the at least one NMOS bias transistor.

The self-biased amplifier circuit comprises complementary input transistors at each input node. This implies that the self-biased amplifier circuit may have low sensitivity of biasing of active region of the input transistors to process, voltage, and temperature (PVT) variations.

The amplifier circuit being self-biased implies that a signal to the gates of the at least one PMOS bias transistor and the at least one NMOS bias transistor may be provided from an internal node within the amplifier circuit. This further implies that the self-biased amplifier circuit may limit its current for low power consumption without any additional current source circuit.

According to an embodiment, the output is connected to the first output node and the second output node for outputting a differential output signal.

Thus, the self-biased amplifier circuit may provide an amplifier circuit with differential input and differential output.

According to an embodiment, the at least one PMOS bias transistor comprises a first PMOS bias transistor and a second PMOS bias transistor and wherein the at least one NMOS bias transistor comprises a first NMOS bias transistor and a second NMOS bias transistor Thus, the self-biased amplifier circuit may comprise two PMOS bias transistors and two NMOS bias transistors.

The sources of the first PMOS input transistor and the second PMOS input transistor may be connected and the sources of the first NMOS input transistor and the second NMOS input transistor may be connected. This implies that the drain of the first PMOS bias transistor is connected to the sources of the PMOS input transistors and that the drain of the second PMOS bias transistor is connected to the sources of the PMOS input transistors. Further, the drain of the first NMOS bias transistor is connected to the sources of the NMOS input transistors and the drain of the second NMOS bias transistor is connected to the sources the NMOS input transistors.

The self-biased amplifier circuit may further comprise a third and a fourth transistor switch, wherein the first transistor switch is connected between the second output node and the gate of the first PMOS bias transistor, the second transistor switch is connected between the second output node and the gate of the first NMOS bias transistor, the third transistor switch is connected between the first output node and the gate of the second PMOS bias transistor, and the fourth transistor switch is connected between the first output node and the gate of the second NMOS bias transistor.

This implies that separate bias transistors are provided for each pair of complementary input transistors.

This also implies that both the first output node and the second output node are used for driving the gates of the bias transistors through each transistor switch.

According to an embodiment, each transistor switch comprises two complementary transistors comprising an p-type transistor and an n-type transistor, wherein the p-type transistor is configured to receive a first enable signal and the n-type transistor is configured to receive a second enable signal for controlling the self-biased amplifier circuit to assume an active mode or a standby mode.

The enable signals may be controlled to provide the desired function to control the self-biased amplifier circuit to assume an active mode or a stand-by mode.

Using pairs of complementary transistors in the transistor switches may provide a better performance of the self-biased amplifier circuit, such as a reduced clock jitter.

According to an alternative each transistor switch may comprise a single transistor, even though performance and tolerance to PVT variations may not be as good as when using pairs of complementary transistors.

According to an embodiment, drains and sources of both complementary transistors in each transistor switch are connected between two common nodes for forming switches between the two common nodes.

The two common nodes may be connected to the gate of a bias transistor and to an output node, respectively, such that the transistors form switches between the gate of the bias transistor and the output node.

According to an embodiment, the self-biased amplifier circuit is configured to form a clock buffer configured to convert a sinusoidal wave signal received at the input to an amplified wave signal at the output.

The self-biased amplifier circuit may be particularly useful as a self-biased clock buffer converting a sinusoidal wave signal to an amplified wave signal which may approximate a square wave signal. For instance, the signal at the output may have a trapezoidal shape. Rising and falling slopes may have same or different rise and fall times.

However, it should be realized that the self-biased amplifier circuit may be used in other manners. For instance, the self-biased amplifier circuit may be used as a feedback amplifier.

According to an embodiment, an on-resistance of the first transistor switch, a gate capacitance of the at least one PMOS bias transistor and a parasitic capacitance at a gate node of the at least one PMOS bias transistor are configured to form a low-pass filter.

A low-pass filter may be formed by each transistor switch, gate capacitance of associated bias transistor and parasitic capacitance of the gate node of the bias transistor.

When frequency of a sinusoidal input signal is larger than a cut-off frequency of the low-pass filter, an output voltage may be averaged to half of supply voltage for a 50% duty cycle.

In this case, gate voltage of the bias transistors may be constant and independent of instantaneous voltage at the output nodes. This implies that gate capacitance of the bias transistors need not be charged and recharged such that unnecessary power consumption may be avoided. Also, response to voltage transitions is fast. Thus, in a self-biased clock buffer, steep slopes of the amplified wave signal may be provided.

According to an embodiment, the self-biased amplifier circuit further comprises at least one first additional transistor switch connected between a supply voltage and the gate of the at least one PMOS bias transistor and at least one second additional transistor switch connected between ground and the gate of the at least one NMOS bias transistor.

These additional transistor switches may be turned on in stand-by mode of the self-biased amplifier circuit to prevent a floating voltage at nodes of the amplifier circuit, such as gate nodes of bias transistors.

When the transistor switches between the first or the second output node and the gates of the at least one PMOS bias transistor and the at least one NMOS bias transistor are turned off, the voltages at the gates of the at least one PMOS bias transistor and the at least one NMOS bias transistor may become undefined.

Thanks to the additional transistor switches, the gates of the bias transistors may be controlled such that the bias transistors are actively turned off in order to actively drive the self-biased amplifier circuit to a non-operating stand-by mode such that power consumption is reduced.

According to a second aspect, there is provided a method for controlling a self-biased amplifier circuit, said method comprising: receiving a differential input signal at an input of the self-biased amplifier circuit, wherein the input comprises a first and a second input node for receiving a first input signal and a second input signal forming the differential input signal, wherein the input comprises a first p-channel metal-oxide-semiconductor (PMOS) input transistor and a first n-channel metal-oxide-semiconductor (NMOS) input transistor forming two complementary input transistors at the first input node and each configured to receive the first input signal at a gate, and wherein the input comprises a second PMOS input transistor and a second NMOS input transistor forming two complementary input transistors at the second input node and each configured to receive the second input signal at a gate, wherein a drain of the first PMOS input transistor and a drain of the first NMOS input transistor are connected to each other to form an inverter defining a first output node therebetween and wherein a drain of the second PMOS input transistor and a drain of the second NMOS input transistor are connected to each other to form an inverter defining a second output node therebetween; providing a first bias current to the first PMOS input transistor and the second PMOS input transistor by at least one PMOS bias transistor, wherein a source of each of the first and the second PMOS input transistor is connected to a drain of the at least one PMOS bias transistor for receiving the bias current, and providing a second bias current to the first NMOS input transistor and the second NMOS input transistor by at least one NMOS bias transistor, wherein a source of each of the first and the second NMOS input transistor is connected to a drain of the at least one NMOS bias transistor for receiving a bias current; and providing control signals to a first and a second transistor switch, wherein the first transistor switch is connected between the first or the second output node and a gate of the at least one PMOS bias transistor, and wherein the second transistor switch is connected between the first or the second output node and a gate of the at least one NMOS bias transistor, wherein the control signals provided to the first and the second transistor switches control the self-biased amplifier circuit to assume an active mode or a standby mode.

Effects and features of this second aspect are largely analogous to those described above in connection with the first aspect. Embodiments mentioned in relation to the second aspect are largely compatible with the first aspect.

The method allows the self-biased amplifier circuit to be controlled to use low power consumption while providing a good performance of the self-biased amplifier circuit.

BRIEF DESCRIPTION OF THE DRAWINGS

The above, as well as additional objects, features, and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
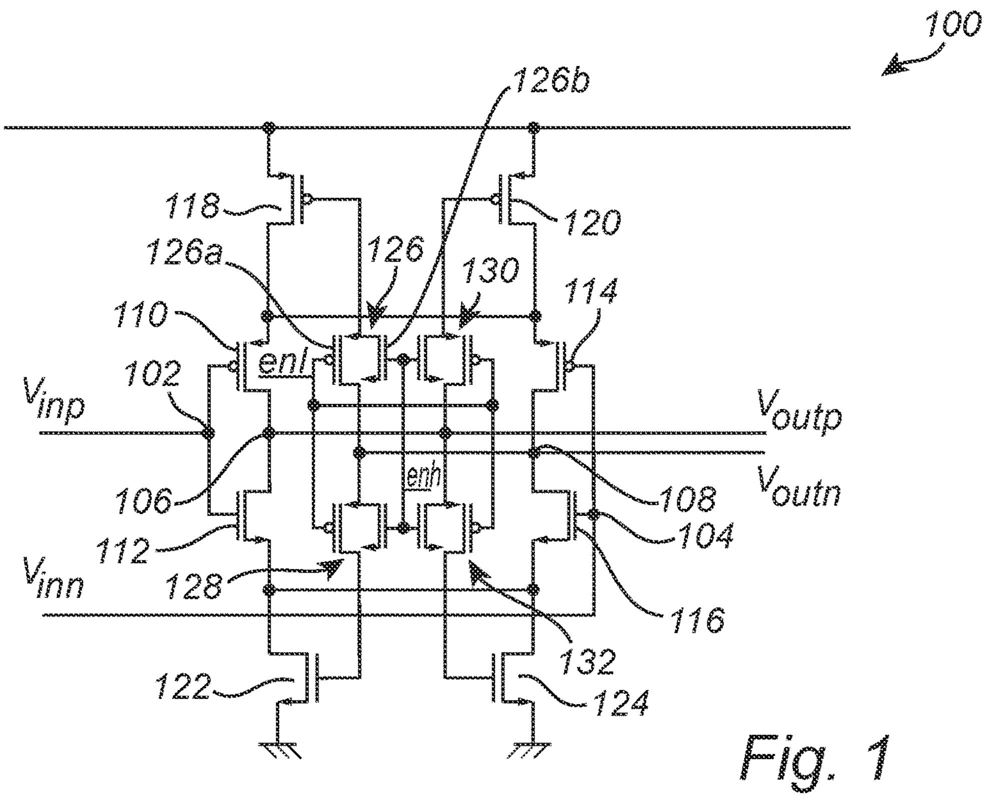
FIG. 1 is a schematic view of a self-biased clock buffer according to a first embodiment.

Referring now to FIG. 1, a self-biased amplifier circuit 100 according to a first embodiment will be disclosed. The self-biased amplifier circuit 100 comprises an input having a first input node 102 and a second input node 104. The self-biased amplifier circuit 100 may thus be configured to receive a differential input signal comprising a first input signal $V_{inp}$ and a second input signal $V_{inn}$. The self-biased amplifier circuit 100 may further be configured to provide a differential output signal at an output having a first output node 106 and a second output node 108.

The self-biased amplifier circuit 100 may form a self-biased clock buffer 100 configured to convert a sinusoid wave signal received at the input to an amplified wave signal at the output which may approximate a square wave. In the following, the self-biased amplifier circuit 100 will be discussed in relation to forming a self-biased clock buffer 100. However, it should be realized that the self-biased amplifier circuit may be used in other applications, taking a different input signal to provide a different output signal.

The self-biased clock buffer 100 comprises a first p-channel metal-oxide-semiconductor (PMOS) input transistor 110 and a first n-channel metal-oxide-semiconductor (NMOS) input transistor 112 forming two complementary input transistors at the first input node 102. The first PMOS input transistor 110 is configured to receive the first input signal $V_{inp}$ at a gate. Also, the first NMOS input transistor 112 is configured to receive the first input signal $V_{inp}$ at a gate. A drain of the first PMOS input transistor 110 and a drain of the first NMOS input transistor 112 are connected to each other to form an inverter defining the first output node 106 therebetween.

The self-biased clock buffer 100 further comprises a second PMOS input transistor 114 and a second NMOS input transistor 116 forming two complementary input transistors at the second input node 104. The second PMOS input transistor 114 is configured to receive the second input signal $V_{inn}$ at a gate. Also, the second NMOS input transistor 116 is configured to receive the second input signal $V_{inn}$ at a gate. A drain of the second PMOS input transistor 114 and a drain of the second NMOS input transistor 116 are connected to each other to form an inverter defining the second output node 108 therebetween.

The self-biased clock buffer 100 further comprises bias transistors such that the input transistors are configured to receive bias currents.

The self-biased clock buffer 100 comprises a first PMOS bias transistor 118 and a second PMOS bias transistor 120. The first PMOS bias transistor 118 comprises a source connected to a positive supply voltage and a drain connected to a source of the first PMOS input transistor 110. The first PMOS input transistor 110 is thus connected to the first PMOS bias transistor 118 so as to receive a bias current.

The second PMOS bias transistor 120 comprises a source connected to a positive supply voltage and a drain connected to a source of the second PMOS input transistor 114. The second PMOS input transistor 114 is thus connected to the second PMOS bias transistor 120 so as to receive a bias current.

Also, the source of the first PMOS input transistor 110 is connected to the source of the second PMOS input transistor 114.

The self-biased clock buffer 100 further comprises a first NMOS bias transistor 122 and a second NMOS bias transistor 124. The first NMOS bias transistor 122 comprises a source connected to negative supply voltage (or ground) and a drain connected to a source of the first NMOS input transistor 112. The first NMOS input transistor 112 is thus connected to the first NMOS bias transistor 122 so as to receive a bias current.

The second NMOS bias transistor 124 comprises a source connected to negative supply voltage or ground and a drain connected to a source of the second NMOS input transistor 116. The second NMOS input transistor 116 is thus connected to the second NMOS bias transistor 124 so as to receive a bias current.

Also, the source of the first NMOS input transistor 112 is connected to the source of the second NMOS input transistor 116.

A gate of each of the bias transistors 118, 120, 122, 124 is connected to an internal node within the clock buffer 100 such that the clock buffer 100 is a self-biased clock buffer 100. The self-biased clock buffer 100 comprises a plurality of transistor switches 126, 128, 130, 132, each transistor switch 126, 128, 130, 132 being connected between the first output node 106 or the second output node 108 and a gate of a respective bias transistor 118, 120, 122, 124. The transistor switches 126, 128, 130, 132 are configured to control the self-biased clock buffer 100 to assume an active mode or a standby mode based on control signals enabling or disabling the transistor switches 126, 128, 130, 132.

The first transistor switch 126 is connected between the second output node 108 and the gate of the first PMOS bias transistor 118. The second transistor switch 128 is connected between the second output node 108 and the gate of the first NMOS bias transistor 122. The third transistor switch 130 is connected between the first output node 106 and the gate of the second PMOS bias transistor 120. The fourth transistor switch 132 is connected between the first output node 106 and the gate of the second NMOS bias transistor 124.

Each transistor switch 126, 128, 130, 132 may comprise two complementary transistors comprising a p-type transistor and an n-type transistor. For instance, the first transistor switch 126 comprises the p-type transistor 126*a* and the n-type transistor 126*b*. The drains and sources of both complementary transistors in each transistor switch are connected between two common nodes for forming switches between the two common nodes.

The p-type transistor 126*a* is configured to receive a first enable signal on a gate of the p-type transistor 126*a* and the n-type transistor 126*b* is configured to receive a second enable signal for controlling the self-biased clock buffer 100 to assume an active mode or a standby mode.

Figure 2:
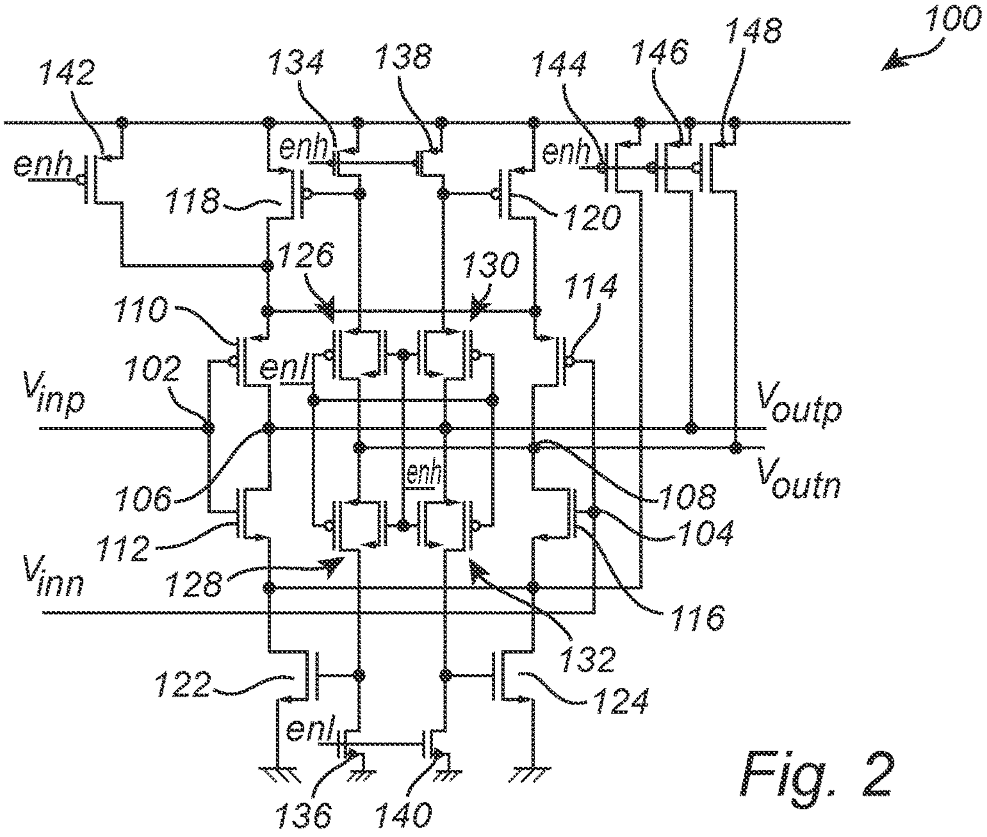
FIG. 2 is a more detailed schematic view of the self-biased clock buffer of the first embodiment.

Referring now to FIG. 2, the self-biased clock buffer 100 may optionally further comprise additional transistor switches 134, 136, 138, 140. A first additional transistor switch 134 may be a p-type transistor switch, having a source connected to positive supply voltage and a drain connected to the gate of the first PMOS bias transistor 118. A second additional transistor switch 136 may be an n-type transistor switch, having a source connected to negative supply voltage and a drain connected to the gate of the first NMOS bias transistor 122. A third additional transistor switch 138 may be a p-type transistor switch, having a source connected to positive supply voltage and a drain connected to the gate of the second PMOS bias transistor 120. A fourth additional transistor switch 140 may be an n-type transistor switch, having a source connected to negative supply voltage and a drain connected to the gate of the second NMOS bias transistor 124.

The additional transistor switches 134, 138 may be connected to receive the second enable signal. This implies that the additional transistor switches 134, 138 may be on, when the transistor switches 126, 128, 130, 132 are off. This may imply that gate voltage of the first and second PMOS bias transistors 118, 120 may be tied to the supply voltage and independent of instantaneous voltage at the first and second output nodes 106, 108. This ensures that no current can flow through the circuit, and a proper power-down operation is achieved.

The additional transistor switches 136, 140 may be connected to receive the first enable signal. This implies that the additional transistor switches 136, 140 may be on, when the transistor switches 126, 128, 130, 132 are off. This may imply that gate voltage of the first and second NMOS bias transistors 122, 124 may be constant and independent of instantaneous voltage at the first and second output nodes 106, 108.

As further shown in FIG. 2, the self-biased clock buffer 100 may optionally further comprise additional transistor switches 142, 144, 146, 148.

A fifth additional transistor switch 142 may be a p-type transistor switch, having a source connected to positive supply voltage and a drain connected to the drains of the first and second PMOS bias transistors 118, 120. A sixth additional transistor switch 144 may be a p-type transistor switch, having a source connected to positive supply voltage and a drain connected to the drains of the first and second NMOS bias transistors 122, 124. A seventh additional transistor switch 146 may be a p-type transistor switch, having a source connected to positive supply voltage and a drain connected to the first output node 106. An eighth additional transistor switch 148 may be a p-type transistor switch, having a source connected to positive supply voltage and a drain connected to the second output node 108.

The additional transistor switches 142, 144, 146, 148 may be connected to receive the second enable signal. This implies that the additional transistor switches 142, 144, 146, 148 may be on, when the transistor switches 126, 128, 130, 132 are off. The additional transistor switches 142, 144, 146,

148 may prevent floating voltages of nodes of the self-biased clock buffer 100 in the stand-by mode.

Figure 3A:
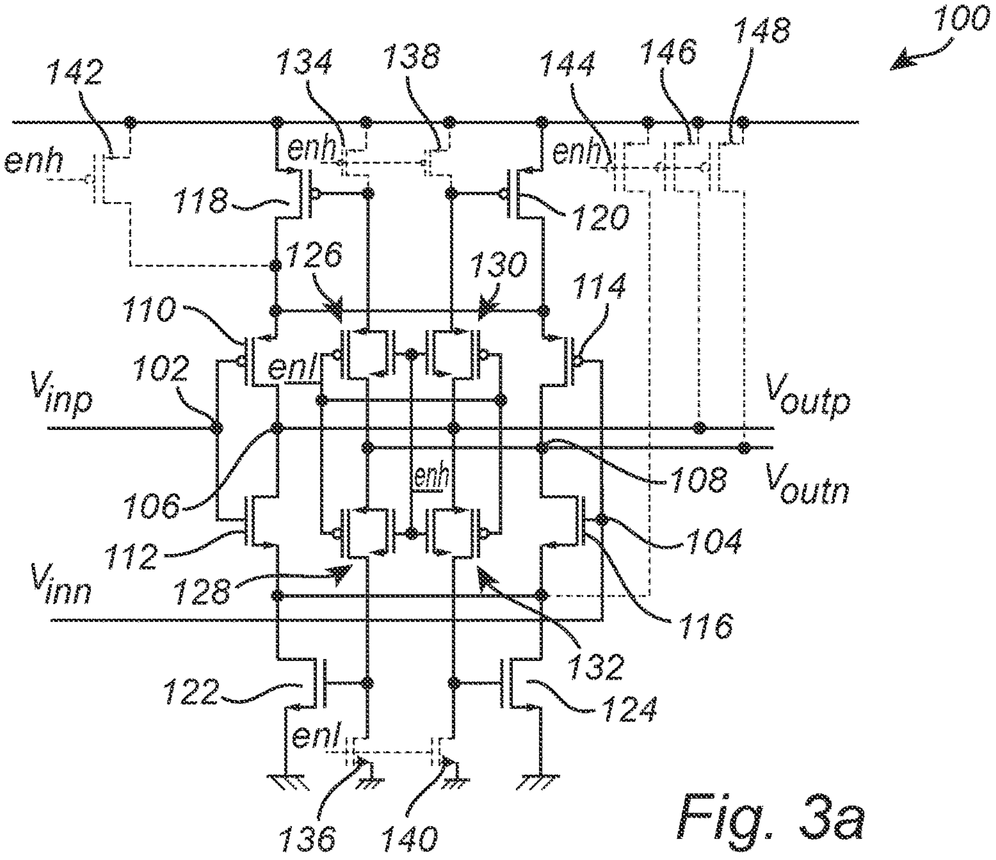
FIG. 3*a* is a schematic view of the self-biased clock buffer of the first embodiment in an active mode.
Figure 3B:
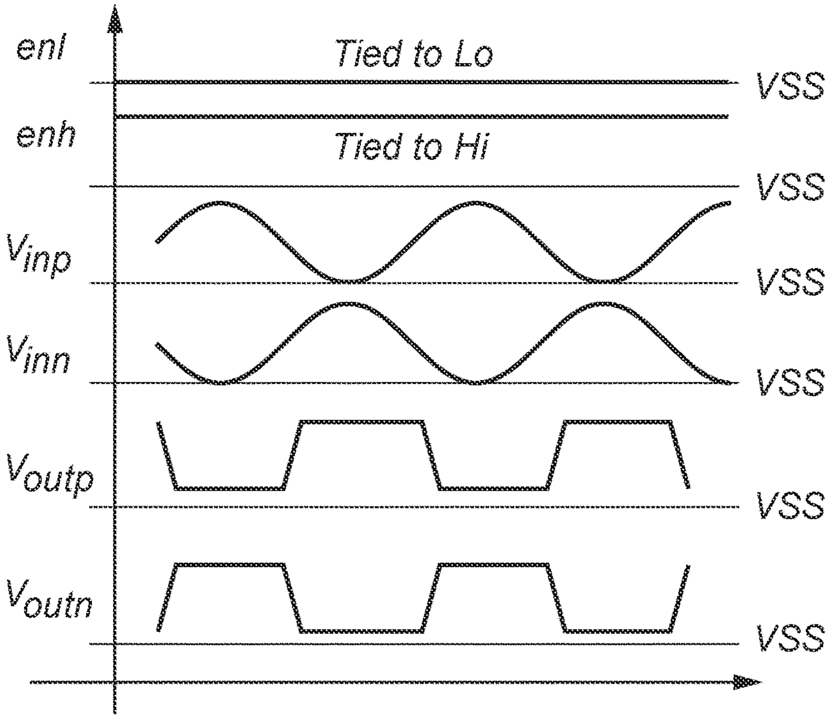
FIG. 3*b* shows input and output signals of the self-biased clock buffer of the first embodiment in the active mode.

It should be realized that one or more of the additional transistor switches 142, 144, 146, 148 may alternatively be an NMOS transistor. An NMOS additional transistor switch 142, 144, 146, 148 may be connected to receive the first enable signal instead of the second enable signal Referring now to FIGS. 3*a*-3*b*, the self-biased clock buffer 100 of FIG. 2 is illustrated in an active mode, wherein the transistor switches being turned off are indicated in grey in FIG. 3*a*. In the active mode, the first enable signal is low (negative supply voltage, VSS) and the second enable signal is high (positive supply voltage, VDD) as indicated in FIG. 3*b* illustrating signals within the self-biased clock buffer 100.

In this case, the transistor switches 126, 128, 130, 132 are turned on. The additional transistor switches 134, 136, 138, 140 and 142, 144, 146, 148 are turned off.

The self-biased clock buffer 100 may receive a differential signal comprising the first input signal $V_{inp}$ and the second input signal $V_{inn}$ forming a sinusoidal wave. Then, output signals $V_{outp}$ and $V_{outn}$ at the first output node 106 and the second output node 108, respectively, driven by the self-biased clock buffer 100 will then become a trapezoidal wave with relatively steep slopes.

Thanks to the arrangement of the transistor switches 126, 128, 130, 132 in the self-biased clock buffer 100, only a small current need to pass through the transistor switches 126, 128, 130, 132, since the transistor switches 126, 128, 130, 132 only need to drive gates of the PMOS bias transistors 118, 120 and the NMOS bias transistors 122, 124, respectively.

The transistor switches 126, 128, 130, 132 may have a small effect on performance of the self-biased clock buffer 100. The self-biased clock buffer 100 may provide a small average current during operation so as to provide a very low power consumption. The self-biased clock buffer 100 may further be configured to insignificantly affect a duty cycle of the clock signal to maintain a 50% duty cycle or very close to 50% duty cycle. Also, the self-biased clock buffer 100 may be configured to provide a very small clock jitter. Also, the self-biased clock buffer 100 may be configured to provide a slew rate of the output waveform such that the output may be close to an ideal square wave.

Figure 4A:
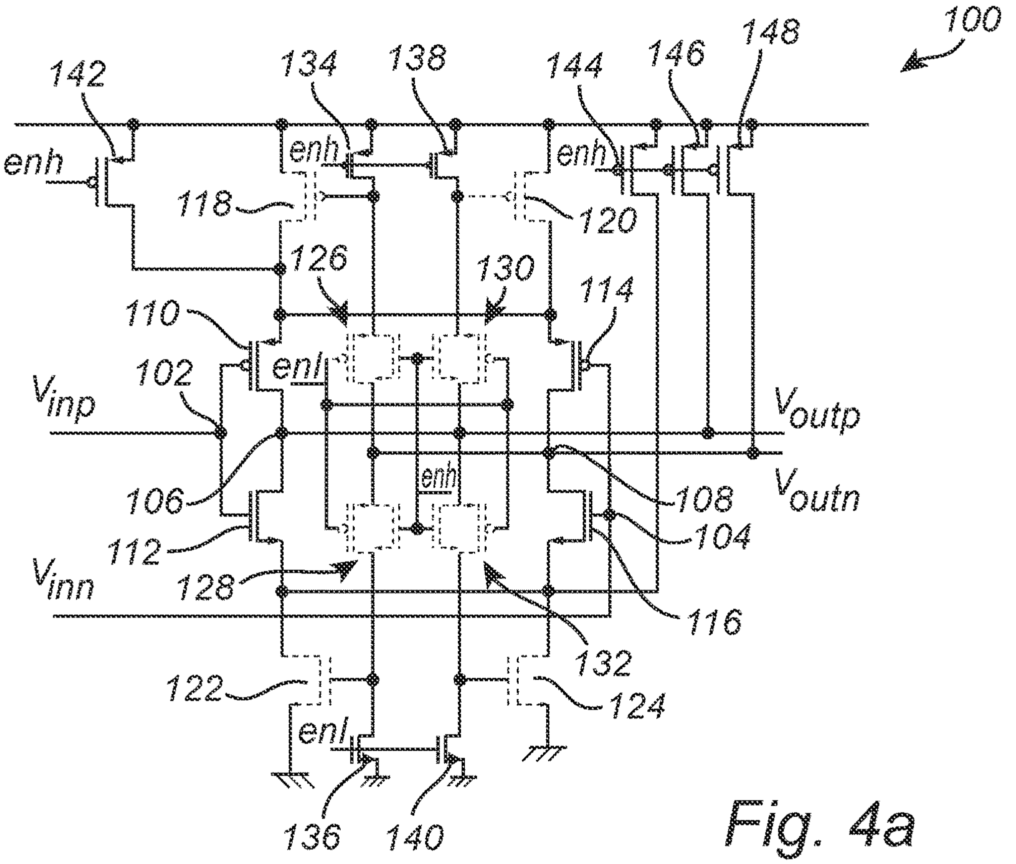
FIG. 4*a* is a schematic view of the self-biased clock buffer of the first embodiment in a stand-by mode.
Figure 4B:
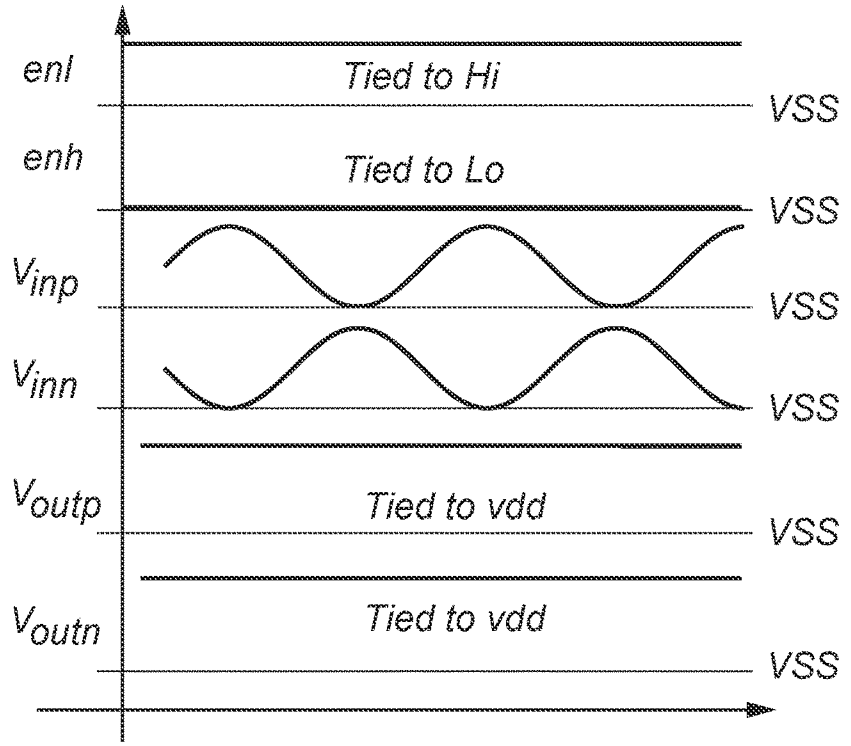
FIG. 4*b* shows input and output signals of the self-biased clock buffer of the first embodiment in the stand-by mode.

Referring now to FIGS. 4*a*-4*b*, the self-biased clock buffer 100 of FIG. 2 is illustrated in a standby mode, wherein the transistor switches being turned off are indicated in grey in FIG. 4*a*. In the standby mode, the first enable signal is high (positive supply voltage, VDD) and the second enable signal is low (negative supply voltage, VSS) as indicated in FIG. 4*b* illustrating signals within the self-biased clock buffer 100.

In this case, the transistor switches 126, 128, 130, 132 are turned off. The additional transistor switches 134, 136, 138, 140 and 142, 144, 146, 148 are turned on.

Internal nodes of the self-biased clock buffer 100 may then be forcedly tied to positive supply voltage or negative supply voltage. This implies that output signals $V_{outp}$ and $V_{outn}$ at the first output node 106 and the second output node 108, respectively, are fixed to positive supply voltage independent of the first input signal $V_{inp}$ and the second input signal $V_{inn}$.

The self-biased clock buffer 100 may tolerate a large on-resistance of the transistor switches 126, 128, 130, 132 without degradation or insignificant degradation of performance. This implies that a size of the transistor switches 126, 128, 130, 132 may be small. Hence, the self-biased amplifier circuit 100 may be compact.

Figure 5:
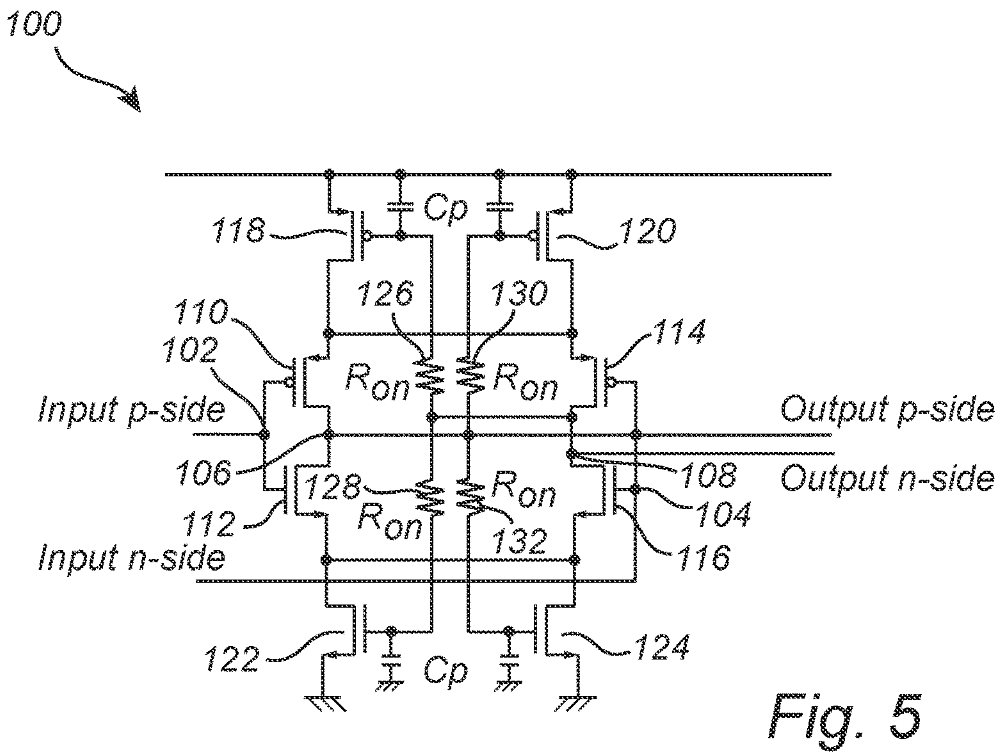
FIG. 5 is a schematic view of the self-biased clock buffer of the first embodiment considering on-resistance of transistor switches.

Referring now to FIG. 5, a representative architecture of the self-biased clock buffer 100 is shown. During operation, the on-resistance $R_{on}$ of the transistor switch 132 and gate capacitance of the second NMOS bias transistor 124 and parasitic capacitance $C_p$ at gate node of the second NMOS bias transistor 124 constitute a low-pass filter.

The differential output voltage of the self-biased clock buffer 100 is ideally a square wave, but when frequency is higher than a cut-off frequency of the low-pass filter, the differential output voltage is averaged to half of positive supply voltage for a 50% duty-cycle at the gate node of the second NMOS bias transistor 124.

This implies that the bias transistors 118, 120, 122, 124 function as a current source because gate voltage at the bias transistors 118, 120, 122, 124 is nearly a DC voltage and independent of an instantaneous voltage at the first output node 106 and the second output node 108.

Therefore, since gate capacitance of the bias transistors 118, 120, 122, 124 does not need to be charged and discharged, unnecessary power consumption is eliminated.

Also, response of rising and falling transitions during voltage transitions is fast because a current to drive an output load capacitance is constant regardless of the output voltage. This results in a steeper slope of the waveform output by the self-biased clock buffer 100.

If an ideal resistor is implemented as the on-resistance $R_{on}$ in FIG. 5, some internal waveforms change according to the value of the resistance. For example, a gate voltage and a gate leakage current at the second NMOS bias transistor 124 are settled when the on-resistance $R_{on}$ is large. This is because the cut-off frequency of the low-pass filter comprised by both of the on-resistance $R_{on}$ and the parasitic capacitance $C_p$ at the gate node of the second NMOS bias transistor 124 becomes low. Moreover, the output voltage is getting steep when the on-resistance $R_{on}$ is large.

Figure 6:
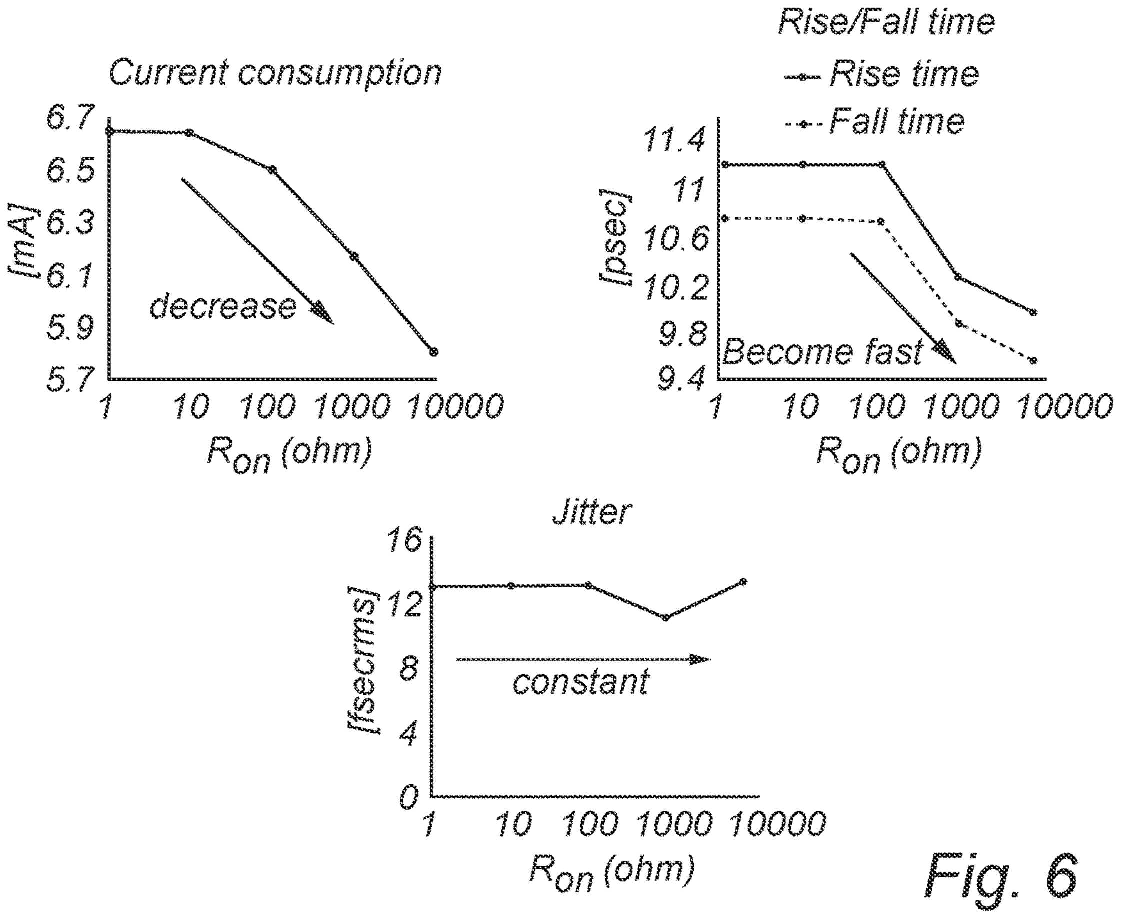
FIG. 6 shows charts illustrating properties of the self-biased clock buffer in dependence of the on-resistance.

Referring now to FIG. 6, some simulation results sweeping the on-resistance $R_{on}$ are shown. As is clear from FIG. 6, a large on-resistance $R_{on}$ can obtain low current consumption and fast transition times without any jitter degradation. As a conclusion, the on-resistance $R_{on}$ is allowed to be large.

This implies that the transistor switches 126, 128, 130, 132 may have a very small size because the large on-resistance is tolerated. The small size of the transistor switches 126, 128, 130, 132 implies that the transistor switches 126, 128, 130, 132 have small parasitic capacitance, such that low power consumption and fast transition time of the self-biased clock buffer 100 may be provided.

Figure 7:
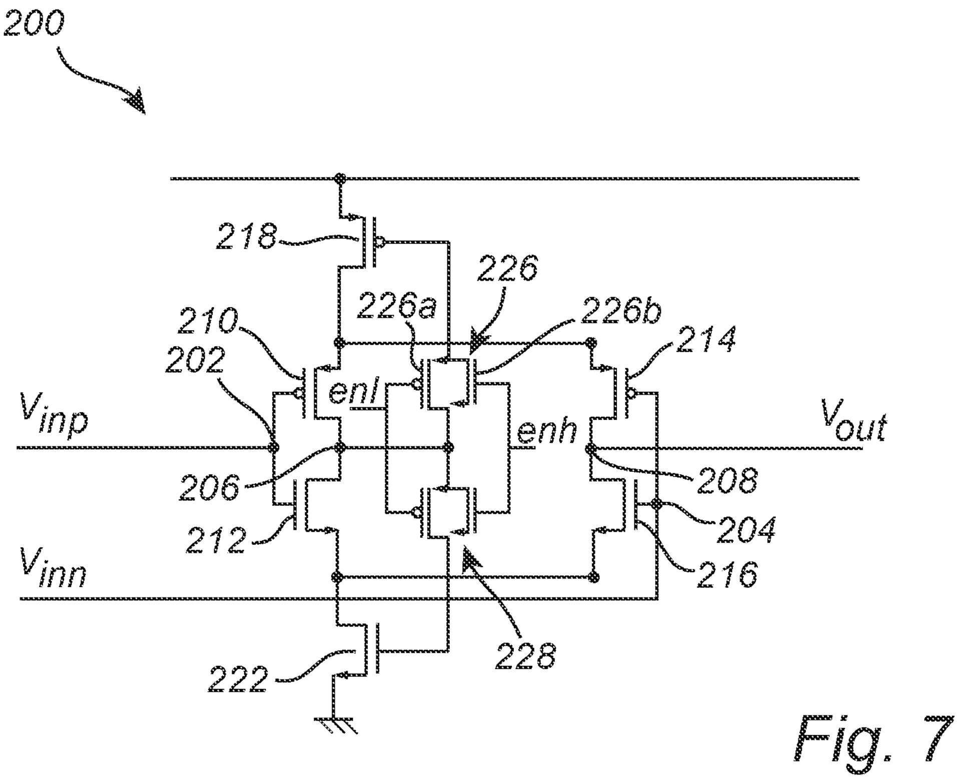
FIG. 7 is a schematic view of the self-biased clock buffer of a second embodiment.

Referring now to FIG. 7, a self-biased clock buffer 200 according to another embodiment will be described.

It should be realized that while the self-biased clock buffer 100 may be configured to receive a differential input signal and to output a differential output signal at an output having a first output node 106 and a second output node 108, the self-biased clock buffer 100 may instead provide a single-ended output by only providing output from one of the first or the second output node 106, 108. In the embodiment of the self-biased clock buffer 200, a differential input signal comprising a first input signal $V_{inp}$ and a second input signal $V_{inn}$ is illustrated and the self-biased clock buffer 200 is further illustrated to provide a single-ended output from the second output node 208. However, it should be realized that the self-biased clock buffer 200 may alternatively be configured to provide a differential output signal.

As shown in FIG. 7, the self-biased clock buffer 200 comprises a first PMOS input transistor 210 and a first NMOS input transistor 212 forming two complementary input transistors at the first input node 202. The first PMOS input transistor 210 is configured to receive the first input signal $V_{inp}$ at a gate. Also, the first NMOS input transistor 212 is configured to receive the first input signal $V_{inp}$ at a gate. A drain of the first PMOS input transistor 210 and a drain of the first NMOS input transistor 212 are connected to each other to form an inverter defining the first output node 206 therebetween.

The self-biased clock buffer 200 further comprises a second PMOS input transistor 214 and a second NMOS input transistor 216 forming two complementary input transistors at the second input node 204. The second PMOS input transistor 214 is configured to receive the second input signal $V_{inn}$ at a gate. Also, the second NMOS input transistor 216 is configured to receive the second input signal $V_{inn}$ at a gate. A drain of the second PMOS input transistor 214 and a drain of the second NMOS input transistor 216 are connected to each other to form an inverter defining the second output node 208 therebetween.

The self-biased clock buffer 200 further comprises bias transistors such that the input transistors are configured to receive bias currents.

The self-biased clock buffer 200 comprises a PMOS bias transistor 218. The PMOS bias transistor 218 comprises a source connected to a positive supply voltage and a drain connected to a source of the first PMOS input transistor 210 and a source of the second PMOS input transistor 214. The first PMOS input transistor 210 is thus connected to the PMOS bias transistor 218 so as to receive a bias current. Also, the second PMOS input transistor 214 is thus connected to the PMOS bias transistor 218 so as to receive a bias current.

Also, the source of the first PMOS input transistor 210 is connected to the source of the second PMOS input transistor 214.

The self-biased clock buffer 200 further comprises an NMOS bias transistor 222. The NMOS bias transistor 222 comprises a source connected to negative supply voltage (or ground) and a drain connected to a source of the first NMOS input transistor 212 and a source of the second NMOS input transistor 216. The first NMOS input transistor 212 is thus connected to the NMOS bias transistor 222 so as to receive a bias current. Also, the second NMOS input transistor 216 is thus connected to the NMOS bias transistor 222 so as to receive a bias current.

Also, the source of the first NMOS input transistor 212 is connected to the source of the second NMOS input transistor 216.

A gate of each of the bias transistors 218, 222 is connected to an internal node within the clock buffer 200 such that the clock buffer 200 is a self-biased clock buffer 200. The self-biased clock buffer 200 comprises a plurality of transistor switches 226, 228, each transistor switch 226, 228 being connected between the first output node 206 or the second output node 208 and a gate of a respective bias transistor 218, 222. The transistor switches 226, 228 are configured to control the self-biased clock buffer 200 to assume an active mode or a standby mode based on control signals enabling or disabling the transistor switches 226, 228.

As shown in FIG. 7, a first transistor switch 226 is connected between the first output node 206 and the gate of the PMOS bias transistor 218. A second transistor switch 228 is connected between the first output node 206 and the gate of the NMOS bias transistor 222.

However, it should be realized that at least one of the transistor switches 226, 228 may alternatively be connected to the second output node 208 and that the transistor switches 226, 228 need not be connected to the same output node.

Each transistor switch 226, 228 may comprise a p-type transistor and an n-type transistor. For instance, the first transistor switch 226 comprises the p-type transistor **226*a* and the n-type transistor 226*b***. The drains and sources of both complementary transistors in each transistor switch are connected between two common nodes for forming switches between the two common nodes.

The p-type transistor **226*a* is configured to receive a first enable signal on a gate of the p-type transistor 226*a* and the n-type transistor 226*b* is configured to receive a second enable signal for controlling the self-biased clock buffer 200** to assume an active mode or a standby mode.

The self-biased clock buffer 200 may present similar advantageous features as set forth above the self-biased clock buffer 100.

It should be realized that, even though not shown in FIG. 7, the self-biased clock buffer 200 may, similar to the self-biased clock buffer 100, comprise a first additional transistor switch and a second additional transistor switch. The first additional transistor switch may be a p-type transistor switch, having a source connected to positive supply voltage and a drain connected to the gate of the PMOS bias transistor 218. The second additional transistor switch may be an n-type transistor switch, having a source connected to negative supply voltage and a drain connected to the gate of the NMOS bias transistor 222.

The first additional transistor switch may be connected to receive the second enable signal and the second additional transistor switch may be connected to receive the first enable signal. This implies that the additional transistor switches may be on, when the transistor switches 226, 228 are off. This may imply that gate voltage of the PMOS bias transistors 218 and the NMOS bias transistor 222 may be tied to the positive supply voltage and negative supply voltage, respectively, and independent of instantaneous voltage at the first output node 206. This ensures that no current can flow through the circuit, and a proper power-down operation is achieved.

Figure 8:
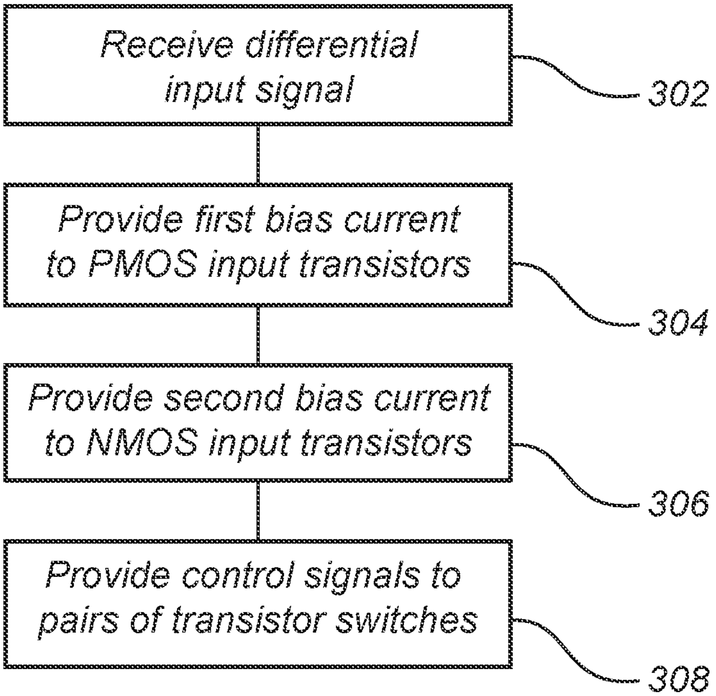
FIG. 8 is a flow chart of a method.

Referring now to FIG. 8, a method for controlling a self-biased amplifier circuit will be described.

The method comprises: receiving 302 a differential input signal at an input of the self-biased amplifier circuit.

As described above, the self-biased amplifier circuit comprises an input having a first input node and a second input node. The self-biased amplifier circuit may thus be configured to receive a differential input signal comprising a first input signal $V_{inp}$ and a second input signal $V_{inn}$. The self-biased amplifier circuit may further be configured to provide a differential output signal at an output having a first output node and a second output node.

The self-biased amplifier circuit comprises a first PMOS input transistor and a first NMOS input transistor forming two complementary input transistors at the first input node. The first PMOS input transistor is configured to receive the first input signal $V_{inp}$ at a gate. Also, the first NMOS input transistor is configured to receive the first input signal $V_{inp}$ at a gate. A drain of the first PMOS input transistor and a drain of the first NMOS input transistor are connected to each other to form an inverter defining the first output node therebetween.

The self-biased amplifier circuit further comprises a second PMOS input transistor and a second NMOS input transistor forming two complementary input transistors at the second input node. The second PMOS input transistor is configured to receive the second input signal $V_{inn}$ at a gate. Also, the second NMOS input transistor is configured to receive the second input signal $V_{inn}$ at a gate. A drain of the second PMOS input transistor and a drain of the second NMOS input transistor are connected to each other to form an inverter defining the second output node therebetween.

The method further comprises providing 304 a first bias current to the first PMOS input transistor and the second PMOS input transistor. The first bias current may be provided by at least one PMOS bias transistor, wherein a source of each of the first and the second PMOS input transistor is connected to a drain of the at least one PMOS bias transistor for receiving the bias current.

The method further comprises providing 306 a second bias current to the first NMOS input transistor and the second NMOS input transistor by at least one NMOS bias transistor, wherein a source of each of the first and the second NMOS input transistor is connected to a drain of the at least one NMOS bias transistor for receiving the bias current.

The method further comprises providing 308 control signals to a first and a second transistor switch.

The first transistor switch is connected between the first or the second output node and a gate of the at least one PMOS bias transistor. The second transistor switch is connected between the first or the second output node and a gate of the at least one NMOS bias transistor. The control signals provided to the first and the second transistor switches control the self-biased amplifier circuit to assume an active mode or a standby mode.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A self-biased amplifier circuit, comprising:

an input, wherein the input comprises a first and a second input node for receiving a first input signal and a second input signal forming a differential input signal, wherein the input comprises a first p-channel metal-oxide-semiconductor (PMOS) input transistor and a first n-channel metal-oxide-semiconductor (NMOS) input transistor forming two complementary input transistors at the first input node and each configured to receive the first input signal at a gate, and wherein the input comprises a second PMOS input transistor and a second NMOS input transistor forming two complementary input transistors at the second input node and each configured to receive the second input signal at a gate, wherein a drain of the first PMOS input transistor and a drain of the first NMOS input transistor are connected to each other to form a first inverter defining a first output node therebetween;

and wherein a drain of the second PMOS input transistor and a drain of the second NMOS input transistor are connected to each other to form a second inverter defining a second output node therebetween;

a first PMOS bias transistor and a first NMOS bias transistor, wherein a source of the first PMOS input transistor is connected to a drain of the first PMOS bias transistor;

wherein a source of the first NMOS input transistor is connected to a drain of the first NMOS bias transistor for providing a bias current to the first inverter;

a second PMOS bias transistor and a second NMOS bias transistor, wherein a source of the second PMOS input transistor is connected to a drain of the second PMOS bias transistor;

wherein a source of the second NMOS input transistor is connected to a drain of the second NMOS bias transistor for providing a bias current to the second inverter;

an output connected to the first output node and an output connected to the second output node for providing an output signal;

wherein the drain of the first PMOS bias transistor is connected to the drain of the second PMOS bias transistor, and wherein the drain of the first NMOS bias transistor is connected to the drain of the second NMOS bias transistor; and a first transistor switch connected between the first or the second output node and a gate of the first PMOS bias transistor, a second transistor switch connected between the first or the second output node and a gate of the first NMOS bias transistor, a third transistor switch connected between the first output node and a gate of the second PMOS bias transistor, and a fourth transistor switch connected between the first output node and a gate of the second NMOS bias transistor, wherein the first, second, third, and fourth transistor switches are configured to control the self-biased amplifier circuit to assume an active mode or a standby mode.

2. A self-biased amplifier circuit, comprising:

an input, wherein the input comprises a first and a second input node for receiving a first input signal and a second input signal forming a differential input signal, wherein the input comprises a first p-channel metal-oxide-semiconductor (PMOS) input transistor and a first n-channel metal-oxide-semiconductor (NMOS) input transistor forming two complementary input transistors at the first input node and each configured to receive the first input signal at a gate, and wherein the input comprises a second PMOS input transistor and a second NMOS input transistor forming two complementary input transistors at the second input node and each configured to receive the second input signal at a gate, wherein a drain of the first PMOS input transistor and a drain of the first NMOS input transistor are connected to each other to form a first inverter defining a first output node therebetween;

wherein a drain of the second PMOS input transistor and a drain of the second NMOS input transistor are connected to each other to form a second inverter defining a second output node therebetween;

a PMOS bias transistor having a source connected to a positive supply voltage and a drain connected to a source of the first PMOS input transistor and a source of the second PMOS input transistor;

an NMOS bias transistor having a source connected to a negative supply voltage or ground, and a drain connected to a source of the first NMOS input transistor and a source of the second NMOS input transistor, a first transistor switch connected between the first output node and a gate of the PMOS bias transistor, a second transistor switch connected between the first output node and a gate of the NMOS bias transistor, wherein the first transistor switches are configured to control the self-biased amplifier circuit to assume an active mode or a standby mode.

3. The self-biased amplifier circuit according to claim 2, having a single output connected to the second output node.

4. The self-biased amplifier circuit according to claim 2, having a differential output with a first output connected to the first output node and a second output connected to the second output node.

5. The self-biased amplifier circuit according to claim 1, wherein each transistor switch comprises two complementary transistors comprising a p-type transistor and an n-type transistor, wherein the p-type transistor is configured to receive a first enable signal and the n-type transistor is configured to receive a second enable signal for controlling the self-biased amplifier circuit to assume an active mode or a standby mode.

6. The self-biased amplifier circuit according to claim 5, wherein drains and sources of both complementary transistors in each transistor switch are connected between two common nodes for forming switches between the two common nodes.

7. The self-biased amplifier circuit according to claim 1, wherein the self-biased amplifier circuit is configured to form a clock buffer configured to convert a sinusoidal wave signal received at the input to an amplified signal at the output.

8. The self-biased amplifier circuit according to claim 1, wherein an on-resistance of the first transistor switch, a gate capacitance of the first PMOS bias transistor and a parasitic capacitance at a gate node of the first PMOS bias transistor are configured to form a first low-pass filter, and wherein an on-resistance of the third transistor switch, a gate capacitance of the second PMOS bias transistor and a parasitic capacitance at a gate node of the second PMOS bias transistor are configured to form a second low-pass filter.

9. The self-biased amplifier circuit according to claim 1, further comprising at least one first additional transistor switch connected between a supply voltage and the gate of at least one PMOS bias transistor and at least one second additional transistor switch connected between ground and the gate of at least one NMOS bias transistor.

10. A method for controlling a self-biased amplifier circuit, said method comprising:

receiving a differential input signal at an input of the self-biased amplifier circuit, wherein the input comprises a first and a second input node for receiving a first input signal and a second input signal forming the differential input signal, wherein the input comprises a first p-channel metal-oxide-semiconductor (PMOS) input transistor and a first n-channel metal-oxide-semiconductor (NMOS) input transistor forming two complementary input transistors at the first input node and each configured to receive the first input signal at a gate, wherein the input comprises a second PMOS input transistor and a second NMOS input transistor forming two complementary input transistors at the second input node and each configured to receive the second input signal at a gate, wherein a drain of the first PMOS input transistor and a drain of the first NMOS input transistor are connected to each other to form a first inverter defining a first output node therebetween;

wherein a drain of the second PMOS input transistor and a drain of the second NMOS input transistor are connected to each other to form a second inverter defining a second output node therebetween;

providing a first bias current to the first PMOS input transistor via a first PMOS bias transistor wherein a source of the first PMOS input transistor is connected to a drain of the first PMOS bias transistor and providing a third bias current to the second PMOS input transistor by a second PMOS bias transistor, wherein a source of the second PMOS input transistor is connected to a drain of the second PMOS bias transistor;

providing a second bias current to the first NMOS input transistor via a first NMOS bias transistor, wherein a source of the first NMOS input transistor is connected to a drain of the first NMOS bias transistor and providing a fourth bias current to the second NMOS input transistor by a second NMOS bias transistor, wherein a source of the second NMOS input transistor is connected to a drain of the second NMOS bias transistor;

wherein the drain of the first PMOS bias transistor is connected to the drain of the second PMOS bias transistor, and wherein the drain of the first NMOS bias transistor is connected to the drain of the second NMOS bias transistor; and providing control signals to a first and second transistor switch, wherein the first transistor switch is connected between the first or the second output node and a gate of the first PMOS bias transistor, and wherein the second transistor switch is connected between the second output node and a gate of the first NMOS bias transistor, and providing the control signals to a third and fourth transistor switch, wherein the third transistor switch is connected between the first output node and a gate of the second PMOS bias transistor, and wherein the fourth transistor switch is connected between the first output node and a gate of the second NMOS bias transistor, wherein the control signals provided to the first transistor switch, the second transistor switch, the third transistor switch and the fourth transistor switch control the self-biased amplifier circuit to assume an active mode or a standby mode.

11. A method for controlling a self-biased amplifier circuit according to claim 2, said method comprising:

providing control signals to the first and second transistor switch to control the self-biased amplifier circuit to assume an active mode or a standby mode.

* * * * *